United States Patent
Verplanken et al.

(10) Patent No.: US 9,979,802 B2
(45) Date of Patent: May 22, 2018

(54) ASSEMBLING RESPONSE PACKETS

(71) Applicant: INTERNATIONAL BUSINESS MACHINES CORPORATION, Armonk, NY (US)

(72) Inventors: Fabrice Jean Verplanken, La Gaude (FR); Francois Abel, Rueschlikon (CH); Jean-Paul Aldebert, Biot (FR); Jean-Luc Frenoy, Cagnes sur Mer (FR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 286 days.

(21) Appl. No.: 14/862,882

(22) Filed: Sep. 23, 2015

(65) Prior Publication Data

US 2016/0105267 A1  Apr. 14, 2016

(30) Foreign Application Priority Data

Sep. 24, 2014  (GB) .................................. 1416827.2

(51) Int. Cl.
*H04L 29/06* (2006.01)
*G11C 15/00* (2006.01)
*G11C 19/00* (2006.01)

(52) U.S. Cl.
CPC ............. *H04L 69/22* (2013.01); *G11C 15/00* (2013.01); *G11C 19/00* (2013.01)

(58) Field of Classification Search
None
See application file for complete search history.

(56) References Cited

U.S. PATENT DOCUMENTS

| 8,219,713 B2 | 7/2012 | Shah et al. |
| 2003/0188056 A1 | 10/2003 | Chemudupati |
| 2004/0039940 A1 | 2/2004 | Cox et al. |
| 2004/0136385 A1* | 7/2004 | Xue ........................ H04L 45/00 370/401 |

(Continued)

FOREIGN PATENT DOCUMENTS

JP          06348869 A       12/1994

OTHER PUBLICATIONS

International Search Report, dated Mar. 31, 2015 from corresponding International Application No. GB1416827.2, 4 pages.

(Continued)

*Primary Examiner* — Yaotang Wang
(74) *Attorney, Agent, or Firm* — Cantor Colburn LLP; Steven Meyers

(57) ABSTRACT

Proposed is an action machine for assembling response packets in a network processor. The action machine comprises: a first register array adapted to store data for entry into fixed-length fields of differing response packets, a fixed-length field having the same length in the differing response packets; and a second register array adapted to store data for entry into variable-length fields of differing response packets, a variable-length field having different values or lengths in the differing response packets. The action machine is adapted to assemble a response packet by combining data stored in the first register array with data stored in the second register array.

13 Claims, 6 Drawing Sheets

(56) References Cited

U.S. PATENT DOCUMENTS

| | | | |
|---|---|---|---|
| 2005/0013299 A1* | 1/2005 | Inoue | G11C 15/00 370/392 |
| 2010/0313001 A1 | 12/2010 | Ishikawa | |
| 2011/0222540 A1 | 9/2011 | Mital et al. | |
| 2012/0159132 A1 | 6/2012 | Abel et al. | |
| 2012/0198213 A1* | 8/2012 | Abel | G06F 9/3016 712/225 |

OTHER PUBLICATIONS

Great Britain Search Report, dated Mar. 31, 2015 from corresponding Great Britain Application No. GB1416827.2, 4 pages.

* cited by examiner

ASSEMBLING RESPONSE PACKETS

RELATED APPLICATION

This application claims priority under 35 U.S.C. 119(a) of Great Britain Application No. 1416827.2, filed Sep. 24, 2014, the entire content of which is incorporated herein by reference.

BACKGROUND OF THE DISCLOSURE

1. Field of the Disclosure

The invention relates to the field of packet processing for data networking. More particularly, the invention relates to assembling response packets in a network processor.

2. Description of the Related Art

Due to the increasing use of data intensive applications such as video streaming or Voice-over-IP via the internet, communication links (e.g. optic or copper cables) and data processing units which are operable to transmit and process a large number of data packets in a short amount of time are needed. Data packet processing supporting such data intensive applications requires significant computational power and the demand for processing power for managing Internet traffic is continuously growing. New types of specialized processors, so called 'network processors', have been developed which are particularly suited for the handling and processing of data packets to be transmitted via a network, in particular the Internet.

Conventionally, network processors were either constructed as general-purpose processors (GPPs) or as application-specific integrated circuits (ASICs). While GPPs provide for high flexibility, they may not be specifically designed for the needs related to network processing and are therefore often too slow. To the contrary, ASICs are integrated circuits (ICs) designed for the particular needs of processing data packets to be transmitted over a network. ASICs can therefore solve their particular tasks very quickly and efficiently, but they are expensive and inflexible.

In network management environments, the interface between a management controller (MC) and a network controller (NC) of a network processor is very important. The Network Controller—Sideband Interface (NC-SI) specification has been created to define a standardized interface that enables a NC to provide network access for a MC, while allowing the NC to simultaneously and transparently provide network access for a host system. The NC-SI specification defines protocols and electrical specifications for a common Sideband Interface (SI) between a MC and a 802.3 Local Area Network (LAN) via one or more external NCs. The NC-SI specification version 1.0.0 was published in July 2009 by the PMCI Working Group of the Distributed Management Task Force (DMTF).

A network processor usually processes data packets by undertaking a parsing step. In doing so, a parser of the network processor extracts and analyzes the contents of packet headers and fields and passes parsed packets or parts thereof to other network processor components. Parsing performance is typically increased by increasing the clock frequency of the logic storing and/or executing a parsing instruction. Said approach requires a more powerful and expensive hardware and leads to an increased power dissipation, an unwelcome effect in financial and ecologic terms.

SUMMARY OF THE DISCLOSURE

According to an aspect of the invention, there is provided an action machine for assembling response packets in a network processor, the action machine comprises: a first register array adapted to store data for entry into fixed-length fields of differing response packets, a fixed-length field having the same length in the differing response packets; and a second register array adapted to store data for entry into variable-length fields of differing response packets, a variable-length field having different values or lengths in the differing response packets, wherein the action machine is adapted to assemble a response packet by combining data stored in the first register array with data stored in the second register array. Embodiments of the invention are based on the observation that a response packet may be generated from a set of fixed-length fields (e.g. R01-R34) and a variable length field. Fields of a first register array may be produced on the fly during the parsing process of a NC-SI command. These fields are either fixed (e.g., SA, DA and EtherType), copied from the NC-SI command (e.g., MCID, HR, IID, ChID), or simply inferred from the type of NC-SI command (e.g, CPT, PLLen and some of the Response and Reason codes). These fields may partially correspond to the Ethernet and control packet headers, and may be referred to as fixed-length fields since they have a common length across different response packets. They may also have a common value (e.g. the same value or a fixed value) across different response packets. A variable length field, on the other hand, is typically involved with a long code path which precludes it to be produced on the fly. Content of a variable-length field is therefore produced after the parsing process. A variable-length may therefore correspond to the variable-length payload of a response packet, and may be referred to as variable-length fields since they are fields that have a different value (e.g. a variable value) or length across different response packets.

Thus, according to embodiments, fields of a response packet may generally be classified into two categories: e.g. a) fixed-length fields that may be produced on the fly during the parsing process of a NC-SI command; and b) variable-length fields that are produced after the parsing process and comprise different values and/or lengths in a plurality of different response packets. Fields of category a) may be automatically populated with the appropriate value(s) during a command parsing process, and such value(s) may therefore be simply read from a memory arrangement without requiring further or additional processing. Steps of category b) may be populated after a command parsing process.

Based on such an observation, embodiments propose to combine fixed-length fields stored in a first register array with a variable-length field stored in a second register array to assemble a response packet. The length of the variable-length field may be specified by one of the fixed-length fields.

In an embodiment, the action machine may be adapted to automatically assemble a response packet in the event that data sufficient to fill the first register array is written to the first register array.

The action machine is adapted to receive selection data from a packet parser. Embodiments may therefore be implemented in conjunction with a packet parser within a network processor for example.

In embodiments, the selection data may contain an address of at least one register of the second register array. An address location may therefore be used to select one or more specific registers of the second register array, thereby enabling data to be written to the one or more specific registers associated with the address. According to requirements or commands represented by selection information, different variable-length fields may thus be built. The second register array may therefore be thought of as a store for a variable packet field, wherein a data value for the variable packet field of a particular packet can be written using an address associated with the selected data within the second register array.

In an embodiment, the registers of the first and second register arrays may be individually addressable so as to enable data to be written to the registers of the first and second register arrays based on data provided to the action machine. The first and second registers may therefore be initialized or prepared with predetermined data, and the data stored may then be modified or edited on an individual register-by-register basis. An embodiment may further comprise a third register array adapted to store selection data for writing data in the second register array. Such an approach of using stored data and an address register to write to a memory may be referred to as an as "indirect addressing approach".

Further, the third register array may comprise: a first register adapted to store an address value; and a second register adapted to store data to be written to the second register array.

The first register array may comprise a plurality of registers adapted to store values for populating fields of a response packet adhering to a standardized communication protocol. In this way, each register may correspond to, and thus store data for, a particular field of a response packet, wherein the properties or characteristics of the fields forming a response packet are defined in accordance with a standard communication protocol or standard.

By way of example, in an embodiment, the first register array may comprise thirty-four (34) byte-wide registers and the standardized communication protocol may adhere to a Network Controller—Sideband Interface, NC-SI, specification. In such an embodiment, each byte-wide register of the first register array may store data for a particular field of a response a packet that adheres to the NC-SI specification. In other words, the registers of the first register array may correspond to fields of an NC-SI response packet, so that fields that are common for different NC-SI response packets can be stored in the registers corresponding to the fields having common definition for different NC-SI response packets. The first register array may therefore comprise N registers, wherein N is the number of fields of a response packet having the same usage (i.e. common definition) across multiple different response packets.

An action machine according to an embodiment may be able to manipulate bytes extracted from NC-SI commands sent by a MC (and/or from NC logic) in order to use them in a command parsing process and/or the assembly of response packets. Byte manipulation may include additions, comparisons, realignments, bit maskings, concatenations, etc. Embodiments may be employed in a network processor. Thus, according to an aspect of the invention, there may be provided a network processor comprising an action machine according to an embodiment.

Embodiments may thus provide a network processor for processing data packets. Such embodiments may provide for improved performance of processing data packets, in particular in the context of multi-gigabit networks for example.

According to another aspect of the invention, there is provided a method of operating an action machine for assembling response packets in a network processor, the action machine comprising: a first register array adapted to store data for entry into fixed-length fields of differing response packets, a fixed-length field having the same length in the differing response packets; and a second register array adapted to store data for entry into variable-length fields of differing response packets, a variable-length field having different values or lengths in the differing response packets, the method comprising: causing the action machine to assemble a response packet by combining fixed-length data stored in the first register array with data stored in the second register array.

According to yet another aspect of the invention, there is provided a computer program product for assembling response packets in a network processor, wherein the computer program product comprises a computer-readable storage medium having computer-readable program code embodied therewith, the computer-readable program code configured to perform all of the steps of a method according to an embodiment.

In an embodiment, a computer system may be provided which comprises: a computer program product according to an embodiment; and one or more processors adapted to perform a method according to an embodiment by execution of the computer-readable program code of said computer program product.

Embodiments of the invention provide for a network processor and method for operating said network processor which may increase the speed of data packet parsing without necessitating the use of more expensive hardware with an increased clock cycle frequency.

Embodiments may be flexibly adaptable to a multitude of different data packet protocols and formats and to a multitude of different network processor hardware architectures.

Embodiments may be highly flexible and fast at the same time by complementing hardware-level performance by a parser being operable to execute flexibly adaptable computer interpretable instructions in the form of software, i.e. in the form of instructions written in a programming language.

A 'network processor' as referred to herein is an integrated circuit which has a feature set specifically targeted at the networking application domain. Network processors usually consist of multiple, connected processing and memory units. Network processors are components of many different types of network equipment such as routers, switches, firewalls, session border controllers and the like.

A 'rule' as referred to herein is a set of computer interpretable instructions specifying how one or more data packets are to be processed. A rule according to embodiments may be a computer-interpretable statement with at least two logical parts: an if-clause and a then-clause, whereby the then-clause is only executed in case the if-clause returns the Boolean value 'true'.

A 'rules repository' as referred to herein is any volatile or non-volatile computer-readable data storage medium having stored a plurality of rules.

The term 'action machines' as referred to herein refers to hardware accelerators which are part of the network processor. Action machines process selected parts of data packets and support functions such as packet parsing and classification, high-speed pattern search, checksum calculation and others.

The term 'picoprocessor' as referred to herein refers to a scaled down RISC processor. A picoprocessor according to some embodiments comprises sixteen 32-bit or thirty-two 16-bit general purpose registers per thread and a one-cycle arithmetic-logical unit (ALU) supporting an instruction set that includes e.g. binary addition and subtraction, bit-wise logical AND, OR and NOT operations, compare operation, a counting function, a logical or arithmetic shift left and right, bit-manipulation commands and others.

A 'packet pointer' as referred to herein is a memory address pointing to a particular bit or byte of a packet.

The term 'working cycle' as referred to herein refers to a logical unit of work. Depending on the embodiment and in particular on the hardware infrastructure of the network processor used in said embodiments, each working cycle may correspond to exactly one clock cycle or to n clock cycles wherein n is an integer larger than 1.

The expression 'loaded data' as used herein refers to any data, including computer-interpretable instructions, which is available for a processor without any additional clock cycle for loading said data. 'Loaded data' can be stored e.g. in one or more registers of said processor or can be part of the inbuilt instruction set of said processor.

A parser, according to embodiments, comprises a set of one or more programmable picoprocessors which are operable to execute one or more rules having been loaded from the rules repository. Said rules comprise computer-interpretable instructions for parsing data packets. Parsing as used herein is the process of determining the structure of a data packet and processing its content. A parser may be 'programmable', as the rules can be easily adapted to any change in the processed data packet type or according to new requirements regarding the processing workflow. A parser comprising the picoprocessors executing the rules can be described as finite state machine. According to some embodiments, the picoprocessors of a parser may further comprise a set of instructions which are integral part of the picoprocessors and are immediately available for execution by the picoprocessors without any additional loading step.

According to further embodiments, a data packet may comprise an envelope (or header) section and a payload section. Rules may be loaded and used by a parser to analyze the data packet. As a result of executing said rules on the data packet, which is one example for executing an analysis step to return a parsing decision, data may be provided to an action machine according to an embodiment. Said data may be used to assemble a response packet having an envelope section and payload section containing information (e.g. field values) in data packet.

A 'parsing decision' as used herein is a processing operation executed by the parser by evaluating on one or more bytes of a data packet in order to determine how the data packet is to be processed and/or responded to. Typically, said parsing decision involves complex operations and may be demanding in terms of computational power.

In a further aspect the invention relates to a computer-readable non-transitory storage medium comprising instructions which, when executed by a processing device, execute the steps of the method of operating a network processor according to an embodiment.

According to the invention an action machine for a network processor, a method for operating said action machine, and computer readable media as described in the appended claims are provided.

BRIEF DESCRIPTION OF THE DRAWINGS

Preferred embodiments of the invention will now be described, by way of example only, with reference to the accompanying drawings in which.

DESCRIPTION OF THE EMBODIMENTS

Figure 1:
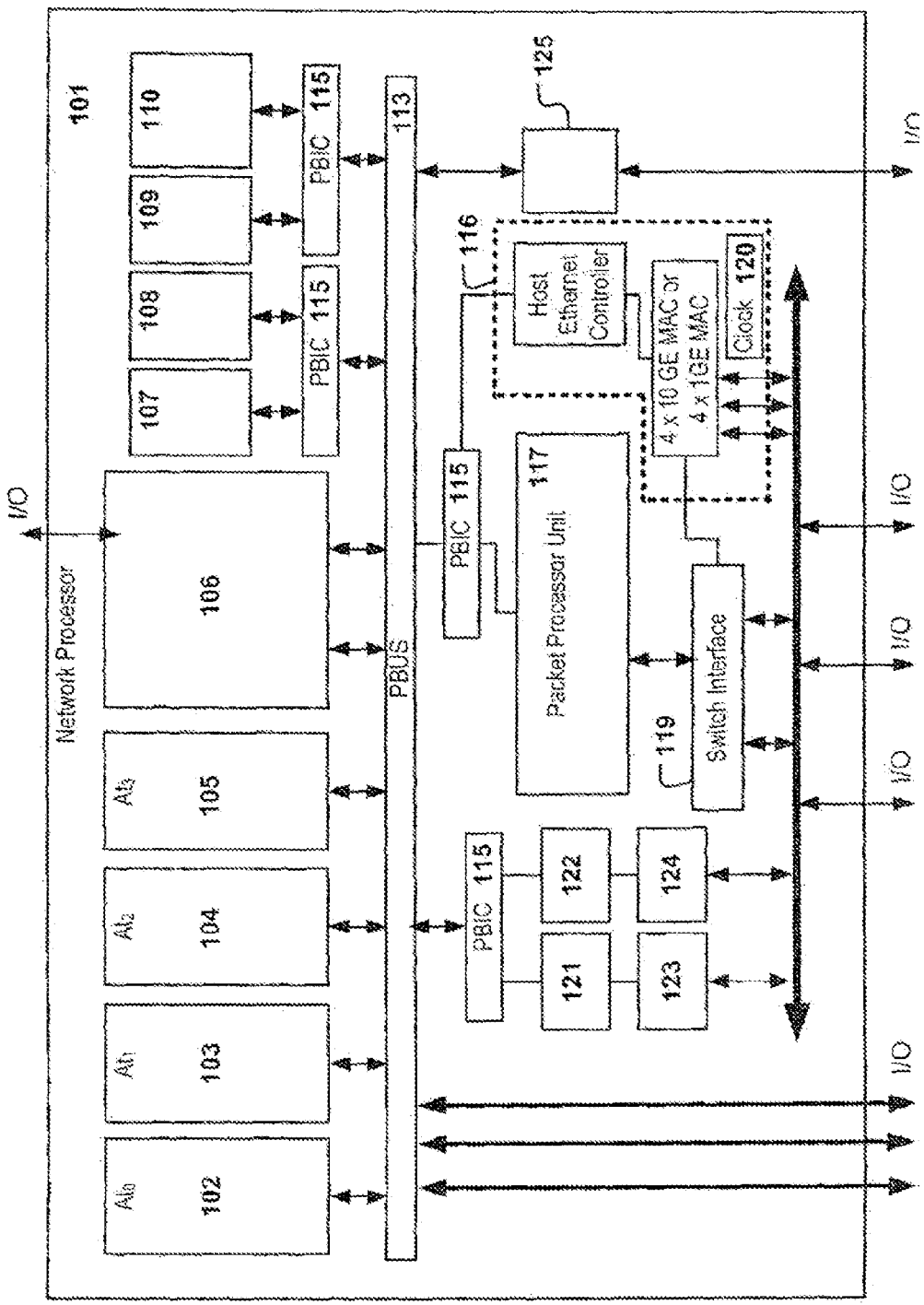
FIG. 1 depicts a high-level network processor architecture.
Figure 2:
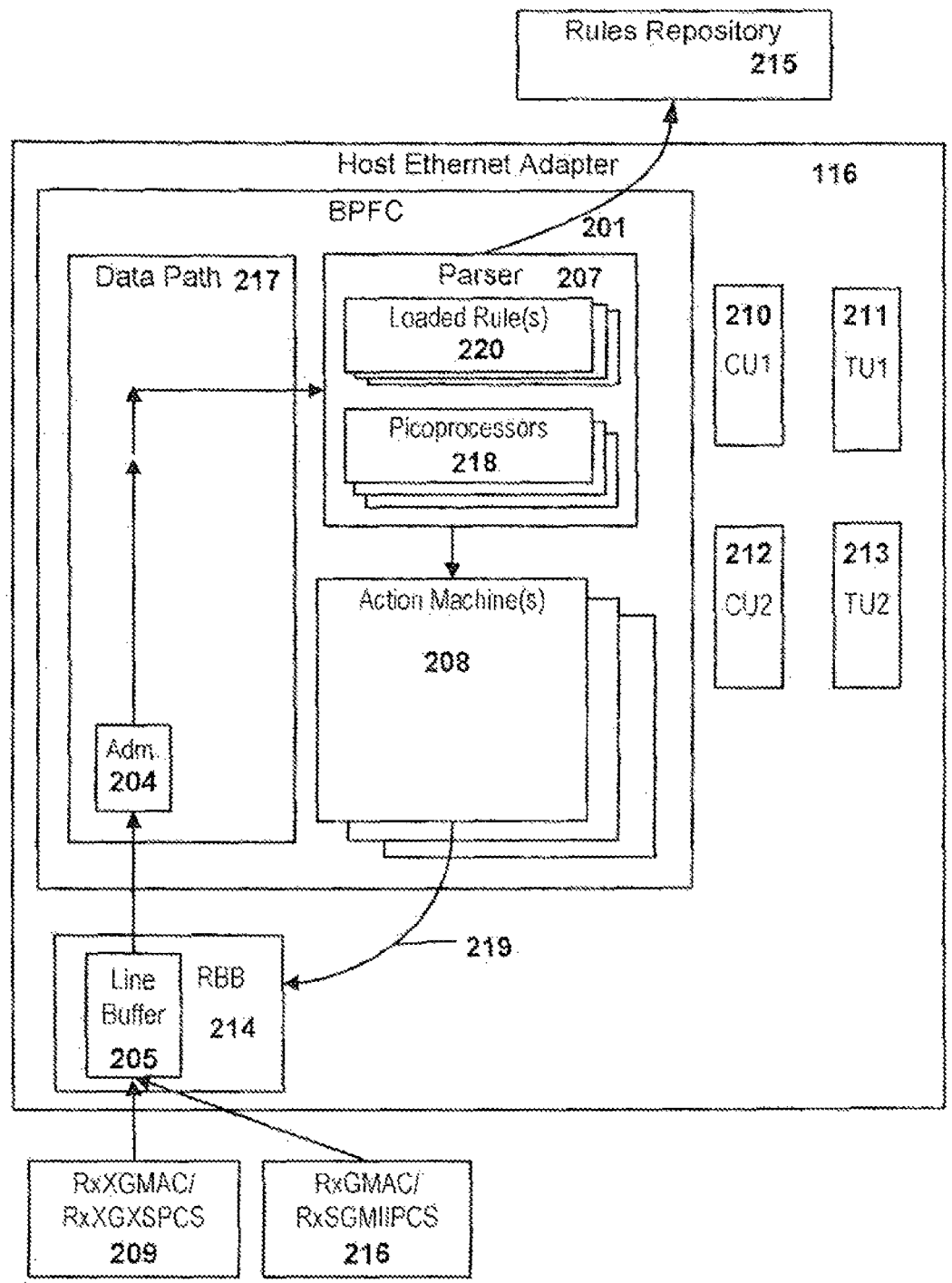
FIG. 2 depicts the host Ethernet adapter being part of the network processor in greater detail.

Illustrative embodiments may be utilized in many different types of data processing environments and/or networks. In order to provide a context for the description of elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented.

FIG. 1 depicts a network processor 101 of the 'Prism' architecture type. Said network processor comprises a multitude of components for receiving, buffering, processing and forwarding data packets. Some core components which can be identified on a high-level perspective, for example:

Processors 102-105 are, according to preferred embodiments, general purpose processors. Each processor may comprise an L2 cache and may be implemented as a combination of a micro-engine performing bit wise serial processing and a RISC processor performing packet/cell queuing. The channel processors can be grouped into a cluster of e.g. four channel processors to provide combined processing for high rate interfaces such as gigabit Ethernet.

The memory access unit 106 is in charge of performing I/O operations on the system memory. Said system memory is the main memory of the device comprising the network processor. Said device could be, for example, a router or a switch.

Several network processor modules 107-110 execute additional functions, e.g. security functions such as encryption, authentication, firewalling, and/or intrusion detection; pattern matching; compression and decompression and others.

A Host Ethernet Adapter (HEA) 116 is a physical Ethernet adapter for the processors 102-105 of the network processor. HEAs offer high throughput, low latency, and virtualization support for Ethernet connections. HEAs are also known as Integrated Virtual Ethernet adapters (IVE adapters). According to embodiments, the HEA supports a network traffic speed of e.g. 4×10 GB/s. A core function of the HEA can be seen as a module providing hardware acceleration for network processing tasks. The HEA comprises a host Ethernet controller and a media access control unit (MAC unit). A MAC is a unique identifier assigned to network interfaces for communication on the physical network segment. MAC addresses are most often assigned by the manufacturer of a network interface card and are stored e.g. in its hardware, the card's read-only memory, or some other firmware mechanism.

PBIC 115 units are interfaces between the bus 113 and other components of the network processor.

The bus 113 interconnects the elements of the network processor.

The Packet Processor Unit 117 comprises several modules for Quality of Service (QoS) functions and data packet scheduling. It comprises a DMA module for direct system memory access. The Packet Processor Unit 117 executes data packet processing of data packets to be transported by the switch interface 119. The switch interface 119 acts as interface of the packet processor unit 117, the HEA and several I/O channels indicated at the bottom of FIG. 1.

Additional modules 121-125 are used for various I/O related functions.

FIG. 2 depicts the host Ethernet adapter 116 which comprises a multitude of modules for receiving, processing and transmitting data packets in greater detail. Only a small subset of components and modules of the HEA is depicted in FIG. 2. Modules for processing data packets 210, 212 and modules 211, 213 for transmitting said data packets can be based—depending on the implementation of the HEA—on a multitude of different hardware and or software components such as memories, ICs, software modules, and the like. Data packets are received from a media interface such as RxXGMAC/RxXGXSPCS (component 209), RxGMAC/RxSGMIIPCS (component 216) or a reduced media independent interface (RMII). Said components 209, 216 are hardware components providing for low level hardware operations comprising e.g. receiving data packets, classifying the received packets and forwarding said data packets to the RBB unit 214. The RBB is operable to execute complex, high-level operations on the data packets which may require a considerable amount of processing time. As the number of data packets received by the RBB from the modules 209, 216 per time unit may exceed the amount of data packets the RBB unit is operable to process, the received data packets are stored in the line buffer 205. A line buffer is a data structure that holds a fixed amount of data in a sequential order, e.g. according to the order the data packets are received by the line buffer; the line buffer 205 together with the RBB unit 214 constitutes a temporary data packet buffer helping to level out differences in the speed of receiving and processing data packages by the RBB unit. The terms 'low-level' and 'high-level' as used herein indicate that 'high-level' operations are typically, but not necessarily, of complex structure, computational demanding and implemented by a software module while 'low-level' operations are typically, but not necessarily, of a more simple nature and are typically implemented by hardware modules, e.g. ASICs.

After having been processed by the RBB unit, the data packets are forwarded from the RBB unit to the BPFC module 201. The BPFC module ('BFSM Parser Filter Checksum') is a module that receives data packets from the RBB unit, processes the received data packets and returns them to the RBB unit (arrow 219). One of the main functions executed by the BPFC unit 201 is to determine which of a plurality of packet queues shall actually receive a particular processed data packet and to check whether said determined packet queue is available and ready to receive a packet. A list of available queues may be stored in a QPN table. The BPFC unit or components thereof further are responsible for tracking the packages and bytes received and processed, for classifying received packets, for checksum calculation and other tasks. The BPFC module 201 comprises three main physical and/or functional units: a data path unit 217, a parser 207 and a set of action machines 208. The term 'unit' or 'module' are used herein synonymously and refer to functional units of a software or hardware component of a network processor. Depending on the embodiment, a 'unit' may correspond to a physical unit, e.g. a particular hardware component or a program module, but it may likewise be the case that multiple functional units for one monolithic hardware block or software module or that functions of one functional unit are distributed among several different hardware- or software modules.

The main function of the data path unit is to expose data packets received from the RBB unit to the parser 207. The admission unit 204, which is a component of the data path unit, controls which data packet received from the RBB unit is allowed to enter the data path and at what speed. The data path ensures that the speed of the data packets entering the data path is in line with the data packet processing speed of the parser 207.

The main function of the parser 207 is to process (e.g. to analyze, inspect and manage) data packets received from the data path unit. The parser decodes one or more fields of the packets in order to determine the packet format (i.e. the protocol used for storing and transmitting the data contained in a data packet). According to preferred embodiments, the parser is implemented as software module and executed by one or more picoprocessors 218. The main objective of the parser according to embodiments of the invention is to analyze the packet and feed other network processor components, in particular packet queues and action machines, with the data packets, whereby the feeding depends on the result of said data packet analysis. The parser 207 is operable to read one or more rules stored in rules repository 215, load said rules into one or more registers of the processor executing the instructions of the parser and to execute the loaded one or more rules on the data packet. According to the depicted embodiment, said one or more registers may be the registers of the picoprocessors 218.

According to embodiments of the invention, the parser can be considered as finite state machine and the rules used by the parser to analyze data packets can be considered as instructions determining when and how a state transition of said finite state machine occurs. The Rules, when executed by the parser, describe and determine how the parser progresses through a set of different states. The rules according to embodiments of the invention allow the software-based parser to be run more efficiently on the picoprocessors 218.

The third major component of the BPFC unit is a set of action machines 208. The action machines are hardware components, e.g. logic blocks being part of the network processor chip. According to some embodiments, said logic blocks may be implemented as ASICs. The action machines are in charge of specific networking tasks such as providing for a MAC-filter or for VLAN filters, for calculating an IP/TCP checksum, for example. However, there is now proposed an action machine for the task of assembling or generating a response packet.

A response packet is a packet sent from a NC to a MC in response to a command (sent from the MC to the NC), for example. Response packets will typically adhere to a standardized communication protocol, so that the responding NC can provide network access for the MC, for example, while allowing the NC to simultaneously and transparently provide network access for a host system. One such widely used standardized communication protocol or interface is defined by the NC-SI specification.

Figure 3:
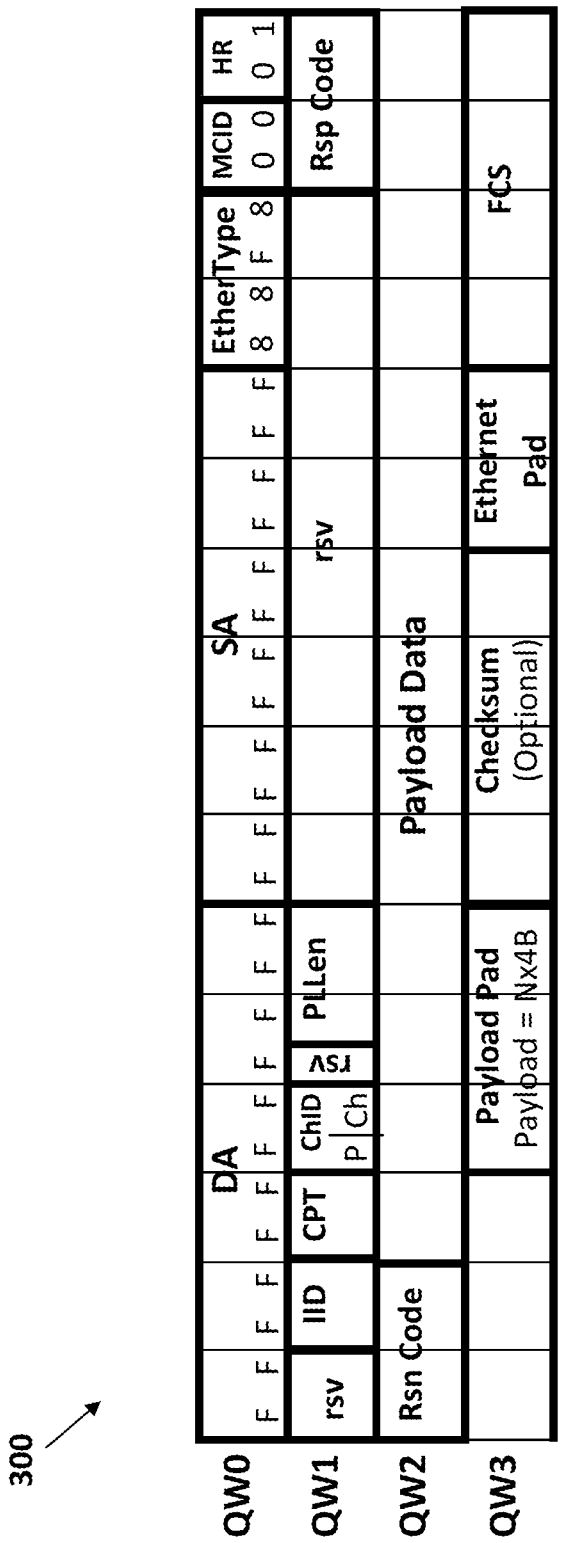
FIG. 3 depicts the structure or format of a NC-SI Control Response Packet.

According to the NC-SI specification, a response should have a certain structure that is formed from a plurality of different fields. The characteristics of the fields, such as size, length, position in a packet, content, possible values, etc, must therefore adhere to predetermined requirements if a response packet is to adhere to the NC-SI specification. FIG. 3 depicts the structure or format of a NC-SI Control Response Packet. The response packet 300 comprises a plurality of ordered fields, wherein each field has characteristics, such size, length, position in a packet, content, possible values, etc. in accordance with the NC-SI specification. The different fields are indicated using labels indicating their function and/or content. A summary of the labeled fields and their associated function and/or content is provided as follows:

DA represents the Destination Address field of the Ethernet header which encapsulates all NC-SI packets. This field is not interpreted by NC and is always set to the broadcast address FF:FF:FF:FF:FF:FF.

SA represents the Source Address field of the Ethernet header which encapsulates all NC-SI-packets. The NC always sets this field to FF:FF:FF:FF:FF:FF for the NC-CSI packets that it generates.

EtherType represents the EtherType field of the Ethernet header which encapsulates all NC-SI packets. This field is always set to the value of 0x88F8.

MCID identifies the MC which has issued the command. This field is fixed to the value of 0x00 in version 1.0.0 of the NC-SI specification.

HR identifies the version of the control packet header used by the sender. The value of 0x01 corresponds to version 1.0.0 of the NC-SI specification.

IID is a sequence number copied from the sequence identifier field used by the corresponding command.

CPT is a Control Packet Type field that identifies the current response among 128 possible type of response.

ChID identifies the package ID and the internal channel ID of the NC which is issuing this response.

PLLen contains the length of the payload data present in the current response frame, excluding Payload Pad and optional Checksum value.

RspCode is a Response Code that provides a general categorization of the status returned to the MC in response to the corresponding NC-SI command.

RsnCode is a Reason Code that provides additional detail to the current Response Code.

Payload Data contains packet-specific data in response to the corresponding NC-SI command issued by the MC.

Payload Pad are 0 to 3 Bytes used to align the Checksum field to a 32-bit boundary and make the overall Payload (Data+Pad) multiple of 4 Bytes. These padding bytes are always equal to 0x00.

Checksum is the 32-bit checksum compensation value computed as the 2's complement of the checksum over the 16-bit unsigned integer values that make up the NC-SI packet. The content of this field is optional and a value of all zeros can be set to specify that the checksum is not being provided for the current response.

FCS represents the Frame Check Sequence field of the Ethernet header which encapsulates all NC-SI packets.

Embodiments are proposed based on the identification that the value of some fields in a response packet is the same for different response packets (e.g., DA, SA, EtherType). In other words, there are fields which are 'fixed' so that their value/data/content and length does not vary across different response packets. These may be considered as being fixed-length fields of a plurality of different response packets. Also, embodiments are proposed based on the identification that the values of some other fields in a response packet are a direct copy from a specific field in the corresponding NC-SI command packet (e.g., MCID, HR, IID, ChID). These fields may be considered as being copied fields from the corresponding NC-SI command packet.

By employing a set of registers, these registers may be pre-filled (at initialization time for example) with a value/data/content that may be used for a plurality of different response packets. Next, by making these registers accessible by the parser which processes the NC-SI command, some fields can be copied from the NC-SI command directly into the NC-SI response by the parser.

Fields which are not common, so that their value/data/content does vary across the different response packets for example, and fields which cannot be copied from the NC-SI command to the corresponding NC-SI response may be referred to as being 'variable'. These variable packets may be filled by a deferred and distinct process from the parsing process.

It is proposed to combine fixed and copied data (from the set of registers covering the fixed and copied fields) with variable data (for variable fields) to assemble a response packet.

Figure 4:
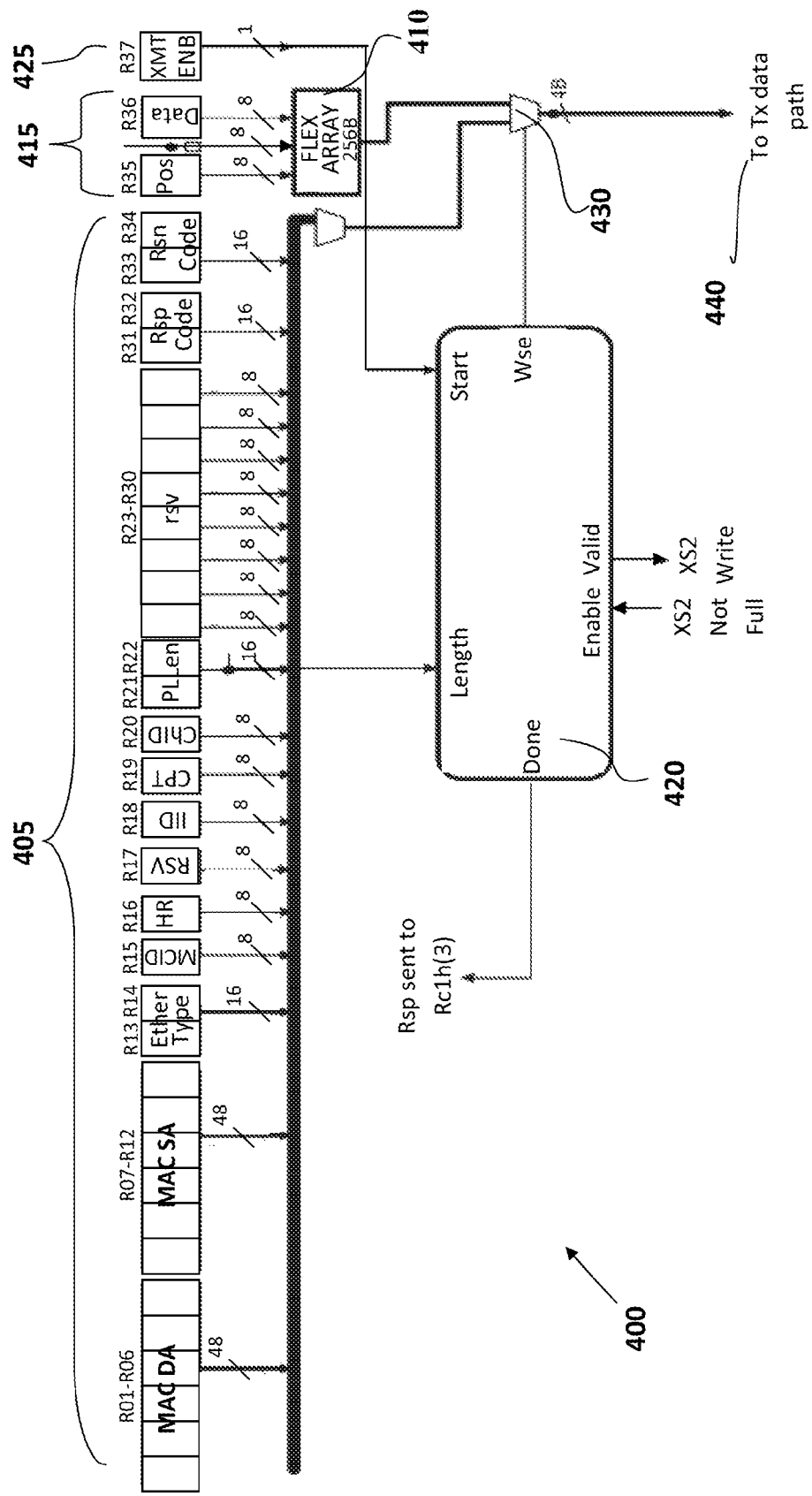
FIG. 4 depicts an action machine for assembling a response packet according to an embodiment.

Thus, referring now to FIG. 4, there is depicted an action machine 400 for assembling or generating a response packet according to an embodiment. The action machine 400 comprises a first register array 405 and a second register array 410.

The first register array 405 is adapted to store fixed and copied data for entry into fixed and copied fields of different response packets. The first register array 405 therefore provides a 'fixed area' which is accessible by a packet parser. A packet parser may fill the registers of the first register array with data for fixed fields having the same data/value in the differing response packets and/or data that is inferred by the parser from the NC-SI command. Here, there first register array 405 is formed from thirty four (34) byte-wide registers for supporting the creation of response packets that adhere to the NC-SI specification.

Each byte-wide register of the first register array 405 is filled by a packet parser with the corresponding byte to be set in a response packet.

The second register array 410 is adapted to store variable data for entry into variable fields of different response packets. Such data may be data that the parser cannot infer from a NC-SI command for example. The second register array 410 therefore provides a 'flexible area' (and may therefore be referred to as a "flex array") which is indirectly accessible by a packet parser via a third register array 415.

The third register array 415 is adapted to store selection data for writing data in the second register array 410. In this example, the third register array comprises: a first register R35 adapted to store an address value; and a second register R36 adapted to store data to be written into the second register array 410. Thus, the second register array 410 can be written to by the parser which uses R35 to specify the address to be written and R36 to specify the data to be written at that address.

The second register array 410 in this example comprises 256 byte-wide registers adapted to store data covering the range of possible data/values for the variable fields having the data/values which vary across different response packets.

For example, a network processor may provide a sequence of possible values to the second register array 410 by providing a sequence of address values and associated data to the first R35 and second R36 registers, respectively, of the third register array 415. The second register array 410 may therefore be initiated to a particular sequence of data values to be used as the variable data of the current NC-SI response packet.

The action machine further comprises a logic arrangement 420 which is adapted to assemble a response packet by combining fixed data stored in the first register array 405 with variable data stored in the second register array 410.

When data sufficient to fill the first register array 405 is written to the first register array, the action machine is adapted to assemble a response packet by combining the fixed data stored in the first register array 405 with the variable data stored in the second register array 410.

Also, in this example, there is provided a signaling register "R37" (labeled 425 in FIG. 4) which provides an 'enable' signal (e.g. a single bit value of 1 or 0) to the logic arrangement 420. The 'enable' signal from the signaling register 425 controls the exposure of the values in the first 405 and second 410 arrays to the logic arrangement 420. In other words, the logic arrangement 420 only combines fixed data stored in the first register array 405 with the variable data from the second register array 410 when triggered by the signaling register 425.

When triggered by the signaling register 425, the logic arrangement 420 starts to assemble a NC-SI response packet in the following way. First, the multiplexer 430 is configured to select data from its input connected to the register set R01-R34. These registers R01 to R34 are then selected in sequence and sent to the TX Data Path 440 through the multiplexer 430. Next, after the sequence corresponding to R01-R34 has been sent out, the multiplexer 430 is reconfigured to select data from its input connected to the second register array 410. A sequence of bytes equal in length to the 16-bit value stored in the tuple {R21, R22} minus the size in bytes of the set R31-R34 (i.e. PLLen-4) is then selected from the second register array 410 and sent to the TX Data Path 440. The sequence of bytes is selected from second register array 410 by the logic arrangement 420 which generates a monotonic sequence of addresses, starting from 0 up to PLLen-4-1, to read the data out of the second register array 410. Thus, the control logic 420 is responsible for reading the content of the second register array 410 (i.e. the flex-array), starting from the beginning of the array and reading as many bytes as specified by the content of register PLLen (R21+R22)].

Figure 5:
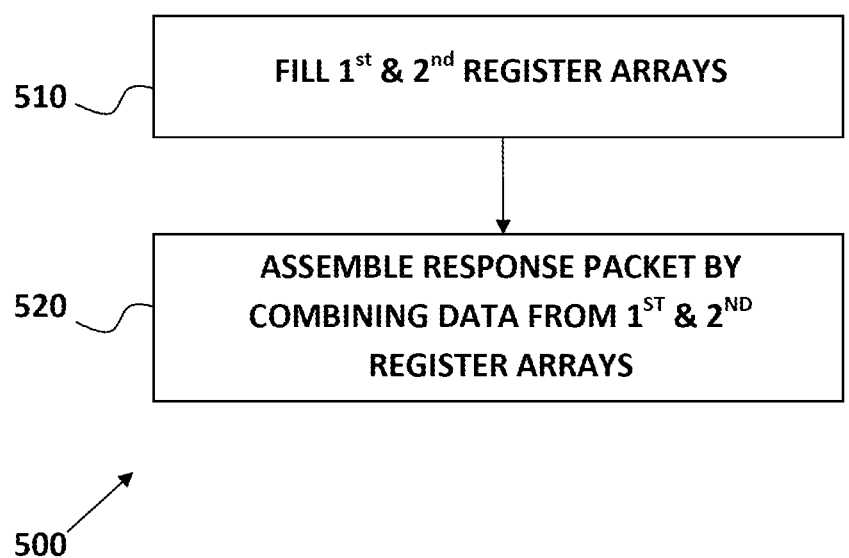
FIG. 5 depicts a flow diagram of a method of operating an action machine for assembling response packets in a network processor according to an embodiment.

Referring now to FIG. 5, there is depicted a flow diagram of a method 500 of operating an action machine for assembling response packets in a network processor according to an embodiment. The method starts when a command packet is received at the network processor having the action machine. The first register array 405 is filled on the fly while the command packet is being received, parsed and analysed by the parser. If the response requires additional variable information, the second register array 410 is filled after the parsing process is finished.

Next, in step 520, the action machine assembles a response packet by combining fixed data stored in the first register array of the action with the variable data stored in the second register array (i.e. the PLLen-4 first bytes of the second register array).

The assembled response packet can then be provided by the network processor for transmission (from NC to MC) via the appropriate communication interface.

Figure 6:
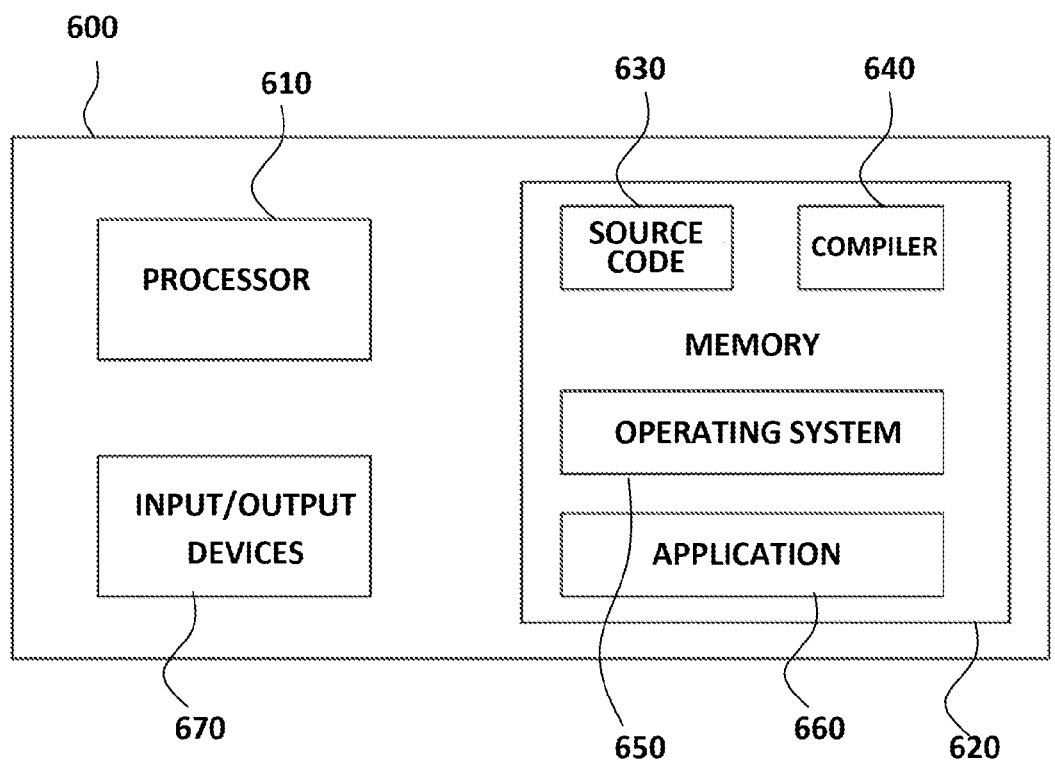
FIG. 6 illustrates an example of a computer in which an embodiment may be employed.

FIG. 6 illustrates an example of a computer 600 in an action machine may be employed. Various operations discussed above may utilize the capabilities of the computer 600. An action machine may be incorporated in any element, module, application, and/or component discussed herein, such as input and/or output (I/O) devices 670.

The computer 600 includes, but is not limited to, PCs, workstations, laptops, PDAs, palm devices, servers, storages, and the like. Generally, in terms of hardware architecture, the computer 600 may include one or more processors 610, memory 620, and one or more I/O devices 670 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620. The processor 610 can be virtually any custom made or commercially available processor, a central processing unit (CPU), a digital signal processor (DSP), or an auxiliary processor among several processors associated with the computer 600, and the processor 610 may be a semiconductor based microprocessor (in the form of a microchip) or a microprocessor.

The memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 620 may incorporate electronic, magnetic, optical, and/or other types of storage media. Note that the memory 620 can have a distributed architecture, where various components are situated remote from one another, but can be accessed by the processor 610.

The software in the memory 620 may include one or more separate programs, each of which comprises an ordered listing of executable instructions for implementing logical functions. The software in the memory 620 includes a suitable operating system (O/S) 650, compiler 640, source code 630, and one or more applications 660 in accordance with exemplary embodiments. As illustrated, the application 660 comprises numerous functional components for implementing the features and operations of the exemplary embodiments. The application 660 of the computer 600 may represent various applications, computational units, logic, functional units, processes, operations, virtual entities, and/or modules in accordance with exemplary embodiments, but the application 660 is not meant to be a limitation.

The operating system 650 controls the execution of other computer programs, and provides scheduling, input-output control, file and data management, memory management, and communication control and related services. It is contemplated by the inventors that the application 660 for implementing exemplary embodiments may be applicable on all commercially available operating systems.

Application 660 may be a source program, executable program (object code), script, or any other entity comprising a set of instructions to be performed. When a source program, then the program is usually translated via a compiler (such as the compiler 640), assembler, interpreter, or the like, which may or may not be included within the memory 620, so as to operate properly in connection with the O/S 650. Furthermore, the application 660 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 670 may include input devices such as, for example but not limited to, a mouse, keyboard, scanner, microphone, camera, etc. Furthermore, the I/O devices 670 may also include output devices, for example but not limited to a printer, display, etc. Finally, the I/O devices 670 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 670 also include components for communicating over various networks, such as the Internet or intranet.

If the computer 600 is a PC, workstation, intelligent device or the like, the software in the memory 620 may further include a basic input output system (BIOS) (omitted for simplicity). The BIOS is a set of essential software routines that initialize and test hardware at startup, start the O/S 650, and support the transfer of data among the hardware devices. The BIOS is stored in some type of read-only-memory, such as ROM, PROM, EPROM, EEPROM or the like, so that the BIOS can be executed when the computer 600 is activated.

When the computer 600 is in operation, the processor 610 is configured to execute software stored within the memory 620, to communicate data to and from the memory 620, and to generally control operations of the computer 600 pursuant to the software. The application 660 and the O/S 650 are read, in whole or in part, by the processor 610, perhaps buffered within the processor 610, and then executed.

When the application 660 is implemented in software it should be noted that the application 660 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

The application 660 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The description has been presented for purposes of illustration and description, and is not intended to be exhaustive or limited to the invention in the form disclosed. Many modifications and variations will be apparent to those of ordinary skill in the art. Embodiments have been chosen and described in order to best explain principles of proposed embodiments, practical application(s), and to enable others of ordinary skill in the art to understand various embodiments with various modifications are contemplated.

What is claimed is:

1. An action machine for assembling response packets in a network processor, the action machine comprises:
   a first register array adapted to store data for entry into fixed-length fields of differing response packets, a fixed-length field having the same length in the differing response packets;
   a second register array adapted to store data for entry into variable-length fields of differing response packets, a variable-length field having different lengths in the differing response packets; and
   a third register array adapted to store selection data for writing data in the second register array wherein the third register array comprises a first register adapted to store an address value and a second register adapted to store data to be written to the second register array,
   wherein the action machine is adapted to assemble a response packet by combining data stored in the first register array with data stored in the second register array.

2. The action machine of claim 1, wherein the action machine is adapted to automatically assemble a response packet in the event that data sufficient to fill the first register array is written to the first register array.

3. The action machine of claim 1, wherein the action machine is adapted to receive data for entry in the first register array from a packet parser of a network processor.

4. The action machine of claim 1, wherein the action machine is adapted to receive selection data containing an address of at least one register of the second register array.

5. The action machine of claim 1, wherein the registers of the first and second register arrays are individually addressable so as to enable data to be written to the registers of the first and second register arrays based on data provided to the action machine.

6. The action machine of claim 1, where in the first register array comprises a plurality of registers adapted to store values for populating fields of a response packet adhering to a standardized communication protocol.

7. The action machine of claim 6, wherein the first register array comprises 34 byte-wide registers and the standardized communication protocol adheres to a Network Controller-Sideband Interface, NC-SI, specification.

8. A network processor comprising an action machine according to claim 1.

9. A method of operating an action machine for assembling response packets in a network processor, the action machine comprising: a first register array adapted to store data for entry into fixed-length fields of differing response packets, a fixed-length field having the same length in the differing response packets; a second register array adapted to store data for entry into variable-length fields of differing response packets, a variable-length field having different lengths in the differing response packets; and a third register array adapted to store selection data for writing data in the second register array wherein the third register array comprises a first register adapted to store an address value and a second register adapted to store data to be written to the second register array, the method comprising:
   causing the action machine to assemble a response packet by combining data stored in the first register array with data stored in the second register array.

10. The method of claim 9, wherein the step causing the action machine to assemble a response packet comprises automatically assembling a response packet in the event that data sufficient to fill the first register array is written to the first register array.

11. The method of claim 9, further comprising receiving data for entry in the first register array from a packet parser of a network processor.

12. A computer program product for assembling response packets in a network processor, wherein the computer program product comprises a non-transitory computer-readable storage medium having computer-readable program code embodied therewith, the computer-readable program code configured to perform all of the steps of a method of operating an action machine for assembling response packets in a network processor, the action machine comprising:

a first register array adapted to store data for entry into fixed-length fields of differing response packets, a fixed-length field having the same length in the differing response packets; a second register array adapted to store data for entry into variable-length fields of differing response packets, a variable-length field having different lengths in the differing response packets; and a third register array adapted to store selection data for writing data in the second register array wherein the third register array comprises a first register adapted to store an address value and a second register adapted to store data to be written to the second register array, the method comprising:

causing the action machine to assemble a response packet by combining data stored in the first register array with data stored in the second register array.

13. The computer program product of claim 12, wherein the computer-readable medium is selected from the group consisting of a CD, a DVD, a flash memory card, a USB memory stick, a random access memory, a read-only memory, a computer hard disk, a storage area network, a network server, and an Internet server.

* * * * *